US010209620B2

(12) United States Patent
Petri et al.

(10) Patent No.: US 10,209,620 B2
(45) Date of Patent: Feb. 19, 2019

(54) ILLUMINATION SYSTEM FOR EUV PROJECTION EXPOSURE APPARATUS, EUV PROJECTION EXPOSURE APPARATUS INCLUDING ILLUMINATION SYSTEM AND METHOD FOR OPERATING AN EUV PROJECTION EXPOSURE APPARATUS

(71) Applicant: Carl Zeiss SMT GmbH, Oberkochen (DE)

(72) Inventors: Christoph Petri, Oberkochen (DE); Daniel Runde, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/892,725

(22) Filed: Feb. 9, 2018

(65) Prior Publication Data

US 2018/0164693 A1     Jun. 14, 2018

Related U.S. Application Data

(63) Continuation of application No. PCT/EP2016/069394, filed on Aug. 16, 2016.

(30) Foreign Application Priority Data

Aug. 28, 2015   (DE) .......................... 10 2015 216 528

(51) Int. Cl.
    *G03F 7/20*     (2006.01)
(52) U.S. Cl.
    CPC ...... *G03F 7/70141* (2013.01); *G03F 7/70033* (2013.01); *G03F 7/7085* (2013.01)

(58) Field of Classification Search
    CPC . G03F 7/70141; G03F 7/70833; G03F 7/7085
    (Continued)

(56) References Cited

U.S. PATENT DOCUMENTS 5,272,501 A * 12/1993 Nishi .................... G03F 9/7049
                                                        355/43
7,473,907 B2   1/2009 Singer et al.
(Continued)

FOREIGN PATENT DOCUMENTS

EP           1605312 A1    12/2005

OTHER PUBLICATIONS

International Search Report and Written Opinion for corresponding Appl No. PCT/EP2016/069394, dated Nov. 28, 2016.
(Continued)

*Primary Examiner* — Hung Nguyen
(74) *Attorney, Agent, or Firm* — Fish & Richardson P.C.

(57) ABSTRACT

An illumination system for an EUV projection exposure apparatus is designed for shaping illumination radiation from at least a portion of received EUV radiation. The illumination radiation is directed into an illumination field in an exit plane of the illumination system during exposure operation. An EUV radiation source is arranged in a source module separate from the illumination system. The illumination system includes an alignment state determining system including an alignment detector configured to receive a portion of the EUV radiation emerging from the secondary radiation source and to generate therefrom an alignment detector signal representative of the alignment state.

20 Claims, 3 Drawing Sheets

(58) Field of Classification Search
USPC .................................. 355/52, 53, 55, 67
See application file for complete search history.

(56) References Cited

U.S. PATENT DOCUMENTS

| | | |
|---|---|---|
| 7,671,347 B2 | 3/2010 | Ehm et al. |
| 2005/0270511 A1 | 12/2005 | Dierichs et al. |
| 2005/0274897 A1 | 12/2005 | Singer et al. |
| 2008/0049206 A1 | 2/2008 | Ossmann |
| 2008/0123807 A1 | 5/2008 | Warm et al. |
| 2008/0246933 A1* | 10/2008 | Uchikawa ............ G03F 7/70883 355/52 |

OTHER PUBLICATIONS

German Office Action for App. Ser. No. 10 2015 216 528.0, dated Apr. 25, 2016 (with English translation), 7 pages.

* cited by examiner

ILLUMINATION SYSTEM FOR EUV PROJECTION EXPOSURE APPARATUS, EUV PROJECTION EXPOSURE APPARATUS INCLUDING ILLUMINATION SYSTEM AND METHOD FOR OPERATING AN EUV PROJECTION EXPOSURE APPARATUS

CROSS-REFERENCE TO RELATED APPLICATIONS

The present application is a continuation of, and claims benefit under 35 USC 120 to, international application PCT/EP2016/069394, filed Aug. 16, 2016, which claims benefit under 35 USC 119 of German Application No. DE 10 2015 216 528.0 filed on Aug. 28, 2006. The entire disclosure of these applications are incorporated by reference herein.

FIELD

The disclosure relates to an illumination system for an EUV projection exposure apparatus, an EUV projection exposure apparatus including such a illumination system, and a method for operating such an EUV projection exposure apparatus.

BACKGROUND

Lithographic projection exposure methods are predominantly used nowadays for producing semiconductor components and other finely structured components, such as, for example, masks for photolithography. In this case, use is made of masks (reticles) or other patterning devices that bear or form the pattern of a structure to be imaged, for example a line pattern of a layer of a semiconductor component. The pattern is positioned in a projection exposure apparatus between an illumination system and a projection lens in the region of the object plane of the projection lens and is illuminated with an illumination radiation shaped by the illumination system. The radiation modified by the pattern travels through the projection lens as projection radiation, the projection lens imaging the pattern with a reduced scale onto the substrate to be exposed. The surface of the substrate is arranged in the image plane of the projection lens optically conjugate to the object plane. The substrate is generally coated with a radiation-sensitive layer (resist, photoresist).

One of the aims in the development of projection exposure apparatuses is to produce lithographically structures having smaller and smaller dimensions on the substrate. In the case of semiconductor components, for example, smaller structures lead to higher integration densities, which generally has an expedient effect on the performance of the structured components produced. One approach involves working with shorter wavelengths of the electromagnetic radiation. By way of example, optical systems have been developed which use electromagnetic radiation from the extreme ultraviolet range (EUV) in particular having operating wavelengths in the range of between 5 nanometers (nm) and 30 nm, in particular of 13.5 nm.

An EUV projection exposure apparatus of the generic type including an illumination system of the generic type is known from U.S. Pat. No. 7,473,907 B2. The illumination system is designed for receiving EUV radiation of an EUV radiation source and for shaping illumination radiation from at least one portion of the received EUV radiation. The illumination radiation is directed into an illumination field in an exit plane of the illumination system during exposure operation, wherein the exit plane of the illumination system and the object plane of the projection lens advantageously coincide. The illumination radiation is characterized by specific illumination parameters and is incident on the pattern within the illumination field with a defined shape and size.

The EUV radiation source, which may be a plasma source, for example, is arranged in a source module separate from the illumination system, the source module generating a secondary radiation source at a source position in an entrance plane of the illumination system.

The image quality in EUV lithography is determined firstly by the projection lens, secondly also by the illumination system and the EUV radiation source and/or the source module. For a good image quality, a predefined spatial intensity distribution, which should normally be as uniform as possible, should be present for example within the illumination field. Furthermore, a predefined angular distribution should be present. A change in the distribution can be caused both in terms of power and in terms of position by a degradation of the EUV radiation source and/or an alteration of the alignment state of the secondary radiation source in relation to the illumination system.

For determining the alignment state of the secondary radiation source in relation to the illumination system or optical components of the illumination system, the illumination system includes an alignment state determining system, e.g. similar or identical to that in U.S. Pat. No. 7,473,907 B2. The alignment state determining system includes at least one alignment detector configured, during exposure operation, to receive a portion of the EUV radiation emerging from the secondary radiation source and to generate therefrom an alignment detector signal representative of the alignment state of the secondary radiation source.

Electromagnetic radiation from the EUV range generally cannot be focused or guided with the aid of refractive optical elements, since the short wavelengths are absorbed by the known optical materials that are transparent at longer wavelengths. Therefore, mirror systems are used in EUV lithography. The illumination system includes at least one mirror module including at least one used mirror element and at least one alignment mirror element. During exposure operation the at least one used mirror element contributes to the shaping of the illumination radiation incident on the illumination field and the at least one alignment mirror element reflects a portion of the EUV radiation of the secondary radiation source directly or indirectly in the direction of the alignment detector.

The plasma generated in the EUV radiation source includes ions and electrons that move at high velocity. As a result, despite possible protection measures, contamination of components of the illumination system can occur, e.g. of a mirror surface of a used mirror element. The contamination can adversely influence the image quality. In order to address this, for example, it is possible to carry out a cleaning of the contaminated components in the installed state, see e.g. U.S. Pat. No. 7,671,347 B2. Degradations based on other mechanisms are also possible.

SUMMARY

The disclosure seeks to provide of the generic type for an EUV projection exposure apparatus, with which illumination system it is possible to ensure a minimum image quality using the alignment state determining system despite possible contamination. The disclosure also seeks to provide an EUV projection exposure apparatus including such an illumination system and a method for operating such an EUV projection exposure apparatus.

In one aspect, the disclosure provides an illumination system for an EUV projection exposure apparatus for receiving EUV radiation of an EUV radiation source and for shaping illumination radiation from at least one portion of the received EUV radiation, wherein the illumination radiation is directed into an illumination field in an exit plane of the illumination system during exposure operation. The EUV radiation source is arranged in a source module separate from the illumination system. The source module generating a secondary radiation source at a source position in an entrance plane of the illumination system. The illumination system includes an alignment state determining system for determining an alignment state of the secondary radiation source in relation to the illumination system. The alignment state determining system includes an alignment detector configured to receive a portion of the EUV radiation emerging from the secondary radiation source and to generate therefrom an alignment detector signal representative of the alignment state. The illumination system also includes a mirror module including a used mirror element and an alignment mirror element. During exposure operation the used mirror element contributes to the shaping of the illumination radiation incident on the illumination field and the alignment mirror element reflects a portion of the EUV radiation of the secondary radiation source in the direction of the alignment detector. The mirror module is embodied as a structurally exchangeable mirror module, and an optical alignment auxiliary component is assigned to the illumination system. With the aid of the optical alignment auxiliary component an alignment auxiliary signal is generatable which allows a checking of the alignment state of the secondary radiation source or of an alignment state of an alignment mirror element after an exchange of the mirror module.

In one aspect, the disclosure provides an EUV-projection exposure apparatus that includes such an illumination system. The apparatus also includes a source module separate from the illumination system with an EUV radiation source for generating EUV radiation wherein the source module generates a secondary radiation source at a source position in an entrance plane of the illumination system. The apparatus further includes an alignment unit signal-connected to the alignment state determining system of the illumination system for aligning the secondary radiation source in relation to the illumination system depending on the alignment detector signal In one aspect, the disclosure provides a method for operating such an EUV projection exposure apparatus. The method includes switching off the secondary radiation source, and exchanging the mirror module. The method also includes switching on the secondary radiation source, and generating an alignment auxiliary signal (AAS, AAS') via the optical alignment auxiliary component. The method further includes checking the alignment state of the secondary radiation source or an alignment state of an alignment mirror element after an exchange of the mirror module via the generated alignment auxiliary signal, and operating the EUV projection exposure apparatus using a result of the checking.

In the illumination system according to the disclosure, the mirror module is embodied as a structurally exchangeable mirror module. The mirror module can include e.g. a common carrier for the at least one used mirror element and the at least one alignment mirror element. The carrier can be fixed on or in a frame structure of the illumination system via releasable connections.

If the mirror module, in particular the at least one used mirror element, is degraded in such a way that the desired minimum image quality thus cannot be achieved or can no longer be achieved for a relatively long time, the mirror module can be exchanged for a new mirror module or a mirror module not degraded so severely or can be demounted for cleaning or for maintenance and be reinstalled later. Consequently, it is not necessary for the entire illumination system to be exchanged.

Furthermore, an optical alignment auxiliary component is assigned to the illumination system according to the disclosure, wherein with the aid of the optical alignment auxiliary component an alignment auxiliary signal is generatable which allows a checking of the alignment state of the secondary radiation source or of an alignment state of the at least one, in particular new, alignment mirror element after an exchange of the mirror module.

An optical alignment auxiliary component is a component which is not required for normal exposure operation and which can be used for temporarily checking the alignment state and is coordinated particularly with the desired aspect for checking the alignment state. The optical alignment auxiliary component operates optically, i.e. using electromagnetic radiation, and can therefore operate without contact.

The inventors have recognized that the possibility exists that the alignment state of the secondary radiation source in relation to the illumination system can vary during the exchange of a mirror module to be exchanged for a new mirror module. This possibility can be referred to as a first cause. Alternatively or additionally, the possibility exists that the alignment state of the at least one new alignment mirror element of the new mirror module is one that is different relative to an alignment state of the old alignment mirror element of the exchanged mirror module, in particular in relation to the at least one alignment detector, e.g. on account of manufacturing tolerances. By way of example, the mirror surface of the alignment mirror element of the new (exchanged) mirror module may have an orientation and/or surface shape different from those/that of the old alignment mirror element. This possibility can be referred to as a second cause.

On account of the first and second causes, the respective occurrence and possible extent of which will generally initially be unknown, after an exchange of the mirror module a correct determination of the alignment state of the secondary radiation source in relation to the illumination system via the alignment state determining system, in particular via the at least one new alignment mirror element, is not readily able to be carried out. This is because the first and second causes may initially be present as mutually inseparable potential causes of a misalignment alternatively or in combination. A reliable reestablishment of the system alignment reference after a mirror module exchange is thus not readily possible.

By using the optical alignment auxiliary component it is possible simply and rapidly to check whether a misalignment is actually present, to what cause(s) it is traced back and how this can be taken into account during further operation in order to be able to resume exposure operation with defined exposure conditions after a mirror module exchange. Consequently, before the EUV projection exposure apparatus is started up again, the above-described problem of a plurality of unknown possible causes of a misalignment can be reduced to the first or the second cause. The cause that remained is then checkable via the alignment state determining system. It is thus possible for the EUV projection exposure apparatus to be started up again simply and rapidly under defined operating conditions.

During exposure operation, the at least one alignment mirror element can directly or indirectly reflect a portion of the EUV radiation of the secondary radiation source in the direction of the alignment detector. The alignment detector signal representative of the alignment state of the secondary radiation source can serve for determining the alignment state directly or indirectly via a comparison with an alignment reference signal for a correct alignment state of the secondary radiation source. Furthermore, the alignment auxiliary signal can be used directly or indirectly via a comparison with an alignment auxiliary reference signal, wherein the alignment auxiliary reference signal represents a correct alignment state of the corresponding component for checking the corresponding alignment state.

Two or more alignment mirror elements can be provided. In particular, the number of alignment mirror elements can be adapted, in particular correspond, to the number of degrees of freedom of the alignment state of the secondary radiation source in relation to the illumination system. Given six degrees of freedom of the alignment state of the secondary radiation source (three translational degrees of freedom and three rotational degrees of freedom) e.g. six alignment mirror elements can thus be present.

Advantageously, the alignment auxiliary signal may allow not just a checking of the alignment state, but a determination of the alignment state of the secondary radiation source or of an alignment state of the at least one, in particular new, alignment mirror element after an exchange of the mirror module. When determining the alignment state, with the aid of the optical alignment auxiliary component the occurrence and additionally the extent of at least one of the two causes can be checked or the alignment auxiliary signal is representative of the alignment state of the corresponding component.

The secondary radiation source is the optical interface between the EUV radiation source and the illumination system. It can be a first intermediate image of the EUV radiation source or a further intermediate image following the first intermediate image.

The EUV projection exposure apparatus includes the illumination system described above and the source module separate from the illumination system. Furthermore, it includes an alignment unit signal-connected to the alignment state determining system of the illumination system for aligning the secondary radiation source in relation to the illumination system or optical components of the illumination system depending on the alignment detector signal. The alignment unit allows the secondary radiation source to be brought to the correct alignment state or kept there.

In the method for operating the EUV projection exposure apparatus mentioned above, in a step (a) the secondary radiation source is switched off. "Switching off" can mean, in particular, that the EUV radiation source can be switched off or shut down and/or masked out via a shutter and/or the secondary radiation source can be masked out via a shutter. This has the effect that when carrying out a step (b) of exchanging the mirror module, no EUV radiation is incident in the illumination system. The illumination system can then be open to the environment for the work for exchanging the mirror module. An evacuation is only involved again before EUV radiation is intended to be radiated into the illumination system.

After the exchange of the mirror module, in a step (c) the secondary radiation source is switched on again in the sense that EUV radiation can emerge again from the secondary radiation source into the illumination system. Moreover, after the exchange of the mirror module, in a step (d) the alignment auxiliary signal is generated via the optical alignment auxiliary component. If the EUV radiation of the secondary radiation source is desired for step (d), step (d) is not carried out until after step (c). In other cases, step (d) can take place before step (c).

If the alignment auxiliary signal is generated, in a step (e) the alignment state of the secondary radiation source or the alignment state of the at least one new alignment mirror element is checked via the generated alignment auxiliary signal.

If the secondary radiation source is not necessary for generating the alignment auxiliary signal via the optical alignment auxiliary component, this can also be switched on again only after the checking (step (e)), but before operation of the EUV projection exposure apparatus using a result of the checking (step (f)). In this context, "operating" can mean that the EUV projection exposure apparatus may be in exposure operation. In particular, in step (f) the EUV projection exposure apparatus can be operated taking account of the new, possibly changed, alignment state of the secondary radiation source.

The checking of the alignment state of the secondary radiation source or of the alignment state of the at least one new alignment mirror element via the generated alignment auxiliary signal in step (e) can be carried out directly via the alignment auxiliary signal or indirectly via a comparison with an alignment auxiliary reference signal (indicative of a correct alignment state of the corresponding component). In particular, the alignment auxiliary reference signal can be generated by generating the alignment auxiliary signal via the optical alignment auxiliary component before step (b) or even before step (a) and defining the alignment auxiliary signal as alignment auxiliary reference signal.

In one development of the disclosure, the illumination system is assigned a positioning device, via which the optical alignment auxiliary component outside exposure operation is positionable into a working position in the illumination beam path of the EUV radiation for generating the alignment auxiliary signal. In order to ensure a propagation of the EUV radiation in the illumination beam path, the illumination system generally has a free space that is free of articles obscuring the EUV radiation for the illumination beam path during exposure operation. The free space can advantageously be used at least partly by the optical alignment auxiliary component outside exposure operation. In particular, the electromagnetic radiation which is used by the optical alignment auxiliary component for checking the alignment state of the secondary radiation source or the alignment state of the at least one alignment mirror element can propagate at least partly along the illumination beam path. Advantageously, the optical alignment auxiliary component can be positionable via the positioning device during exposure operation into a storage position outside the illumination beam path of the EUV radiation in particular within a housing of the illumination system or on the latter. In particular, no checking of the alignment state of the secondary radiation source or of the alignment state of the at least one alignment mirror element may then be possible with the aid of the optical alignment auxiliary component.

At the latest before step (d), in particular before step (b) or even before step (a), in a step (u) the optical alignment auxiliary component outside exposure operation is positioned into the working position in the illumination beam path of the EUV radiation via the positioning device for generating the alignment auxiliary signal. After step (d), at the latest before step (f), in a step (y) the optical alignment auxiliary component is removed from the illumination beam path of the EUV radiation, in particular is positioned into the storage position via the positioning device.

The positioning device can include a positioning mechanism, such as e.g. a displacement mechanism. In particular, in one configuration of the disclosure, the positioning device includes a folding mechanism. The folding mechanism allows a particularly accurately reproducible positioning of the optical auxiliary component in the working position. Moreover, the folding mechanism may allow a space-saving arrangement of the optical auxiliary component in the housing or on the latter. In particular, step (u) and/or step (y) can include folding or pivoting the optical alignment auxiliary component into the working position and/or out of the working position.

In one configuration of the disclosure, the optical alignment auxiliary component includes at least one alignment auxiliary mirror configured, in the working position, to reflect directly or indirectly at least one portion of the EUV radiation emerging from the secondary radiation source in the direction of the alignment detector. A detector signal of the alignment detector generated as a result is the alignment auxiliary signal. Consequently, the alignment state of the secondary radiation source can be checked with the aid of the EUV radiation emitted by the latter; that is to say the occurrence of the first cause. Advantageously, the at least one alignment auxiliary mirror in the working position in the illumination beam path can be arranged optically between the secondary radiation source and the mirror module in such a way that it can shade the at least one alignment mirror element. Then no EUV radiation can be incident on the at least one alignment mirror element and/or be reflected from the latter in the direction of the alignment detector, which otherwise might corrupt the checking of the alignment state of the secondary radiation source SLS after the exchange of the mirror module MM. If the positioning device includes the folding mechanism, the alignment auxiliary mirror can be referred to as a folding mirror. Two or more alignment auxiliary mirrors can be provided. In particular, the number of alignment auxiliary mirrors, like the number of alignment mirror elements, can be adapted, in particular correspond, to the number of degrees of freedom of the alignment state of the secondary radiation source in relation to the illumination system. Given six degrees of freedom of the alignment state of the secondary radiation source (three translational degrees of freedom and three rotational degrees of freedom) six alignment auxiliary mirrors can be present.

After step (c) in a step (v) at least one portion of the EUV radiation emerging from the secondary radiation source is reflected in the direction of the alignment detector via the alignment auxiliary mirror in the working position for generating the alignment auxiliary signal in step (d).

In one development of the disclosure, the alignment unit is configured for aligning the secondary radiation source depending on the alignment auxiliary signal if the alignment auxiliary signal is representative of the alignment state of the secondary radiation source. In particular, the method can include before step (f) aligning the secondary radiation source depending on the alignment auxiliary signal if the alignment auxiliary signal is representative of the alignment state of the secondary radiation source. Afterwards, if appropriate after step (c) and/or (y), a new alignment reference signal can be generated by generating the alignment detector signal and defining the alignment detector signal as alignment reference signal. In step (f) the EUV projection exposure apparatus can be operated taking account of the new, possibly changed, alignment state of the secondary radiation source.

In one development of the disclosure, the optical alignment auxiliary component includes an alignment auxiliary radiation source configured to generate electromagnetic auxiliary radiation that is directed in the direction of the at least one alignment mirror element, wherein the alignment auxiliary signal is generated from at least one portion of the auxiliary radiation reflected from the alignment mirror element, in particular being representative of the alignment state thereof. Consequently, the alignment state of the at least one alignment mirror element can be checked; that is to say the occurrence of the second cause.

In a step (w) the auxiliary radiation is generated via the alignment auxiliary radiation source, wherein the auxiliary radiation is directed in the direction of the at least one alignment mirror element, wherein in step (d) the alignment auxiliary signal is generated from at least one portion of the auxiliary radiation reflected from the alignment mirror element, in particular being representative of the alignment state thereof.

If the at least one alignment mirror element is embodied as an alignable alignment mirror element, the method can include before step (f) aligning the at least one alignment mirror element into its correct alignment state depending on the alignment auxiliary signal if the alignment auxiliary signal is representative of the alignment state of the alignment mirror element. In particular, the alignment mirror element can be aligned with the illumination system open to the environment. Afterwards, it is possible to continue to use the previous alignment reference signal for a correct alignment state of the secondary radiation source. Alternatively or additionally, the method can include before step (f) defining the determined alignment state of the at least one alignment mirror element as the new correct alignment state; in this case the alignment auxiliary signal is representative of the alignment state of the alignment mirror element. The method can then include deriving a new alignment reference signal for a correct alignment state of the secondary radiation source from the alignment auxiliary signal.

In one configuration of the disclosure, the positioning device is designed to position the alignment auxiliary radiation source in the working position in or near the source position of the secondary radiation source. "Near" can mean that the alignment auxiliary radiation source in the illumination beam path may be spatially nearer the source position than the at least one alignment mirror element. In particular, the alignment auxiliary radiation source can simulate the secondary radiation source in its correct alignment state. Advantageously, step (u) can include positioning the alignment auxiliary radiation source near, in particular in, the source position of the secondary radiation source.

In one configuration of the disclosure, a wavelength of the electromagnetic auxiliary radiation is in the UV range (between 150 nm and 380 nm), VIS range (between 380 nm and 780 nm) or in the IR range (between 780 nm and 3000 nm). Consequently, the auxiliary radiation experiences little or even no absorption by air, for example if the illumination system is open to the environment for work for exchanging the mirror module and/or for aligning the at least one alignment mirror element. The alignment auxiliary radiation source can include in particular a light emitting diode and/or a laser.

In one configuration of the disclosure, the illumination system is assigned an alignment auxiliary detector separate from the alignment detector, the alignment auxiliary detector being configured to receive at least one portion of the auxiliary radiation reflected from the at least one alignment mirror element and to generate the alignment auxiliary signal therefrom. In particular, the alignment auxiliary detector may be involved if the reflected auxiliary radiation is not directed in the direction of the alignment detector and/or the alignment detector is not suitable for receiving the auxiliary radiation. Advantageously, the illumination system can be assigned a further positioning device, via which the alignment auxiliary detector outside exposure operation is positionable into a further working position in the illumination beam path of the EUV radiation, preferably directly upstream of the alignment detector, for generating the alignment auxiliary signal.

In a step (x) at least one portion of the auxiliary radiation reflected from the alignment mirror element is received via the alignment auxiliary detector, wherein in step (d) the alignment auxiliary signal is generated from the auxiliary radiation received by the alignment auxiliary detector via the alignment auxiliary detector. Advantageously, before step (x), via the further positioning device, if present, the alignment auxiliary detector outside exposure operation can be positioned into the further working position in the illumination beam path of the EUV radiation, preferably directly upstream of the alignment detector, for generating the alignment auxiliary signal. After step (d), at the latest before step (f), the alignment auxiliary detector can then be removed from the illumination beam path of the EUV radiation, in particular via the further positioning device, into a further storage position.

In one development of the disclosure, the at least one used mirror element optically directly follows the entrance plane in the illumination beam path. Consequently, the at least one used mirror element can be contaminated to a particularly great extent. In particular, the at least one used mirror element can include a field facet mirror or be a field facet mirror.

BRIEF DESCRIPTION OF THE DRAWINGS

Further advantages and aspects of the disclosure are evident from the claims and from the following description of preferred embodiments of the disclosure which are explained below with reference to the figures, in which:

DETAILED DESCRIPTION OF THE EXEMPLARY EMBODIMENTS

Figure 1:
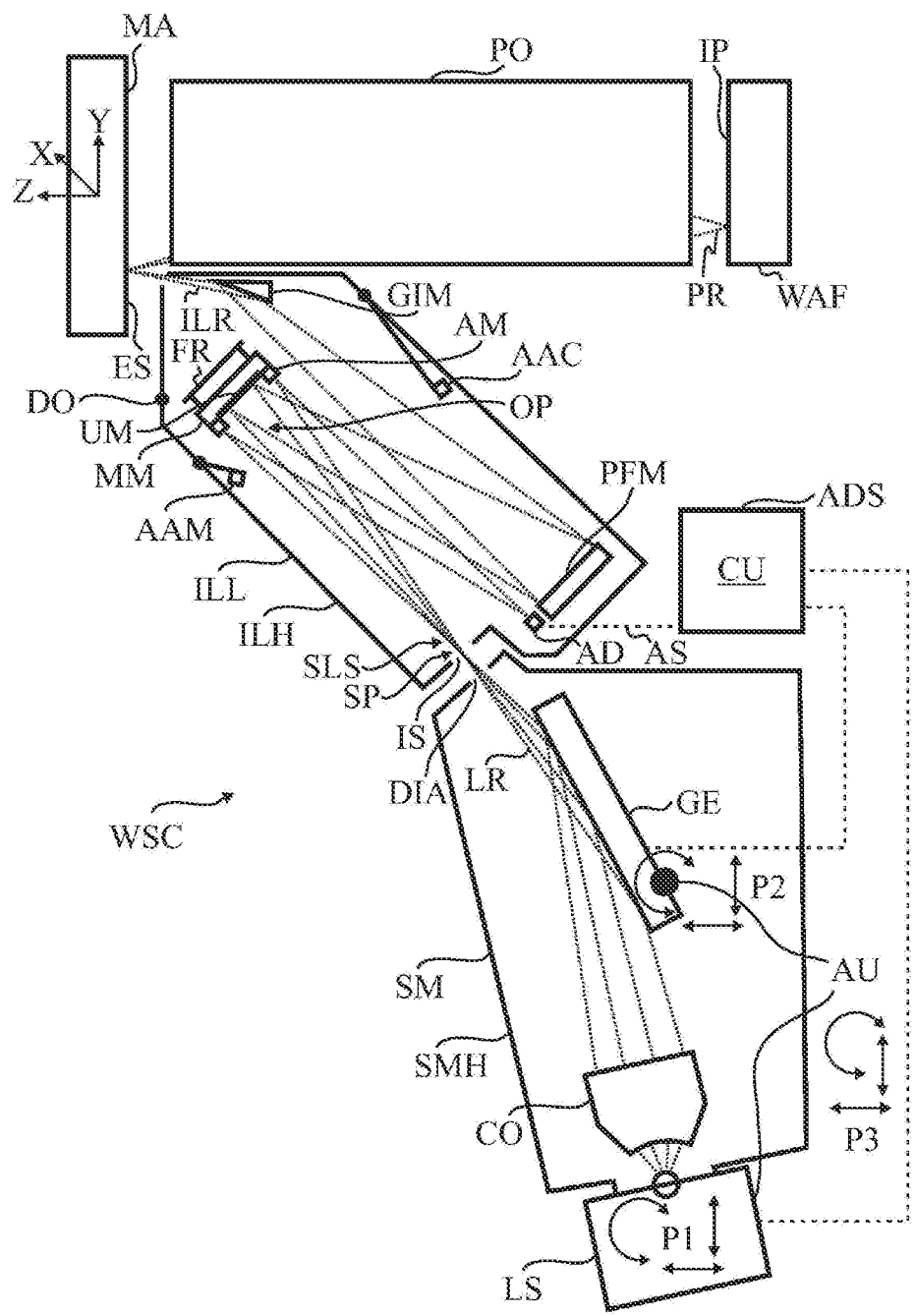
FIG. 1 shows a schematic illustration of an EUV projection exposure apparatus including an illumination system with an optical alignment auxiliary component in a storage position in accordance with one embodiment of the disclosure.
Figure 2:
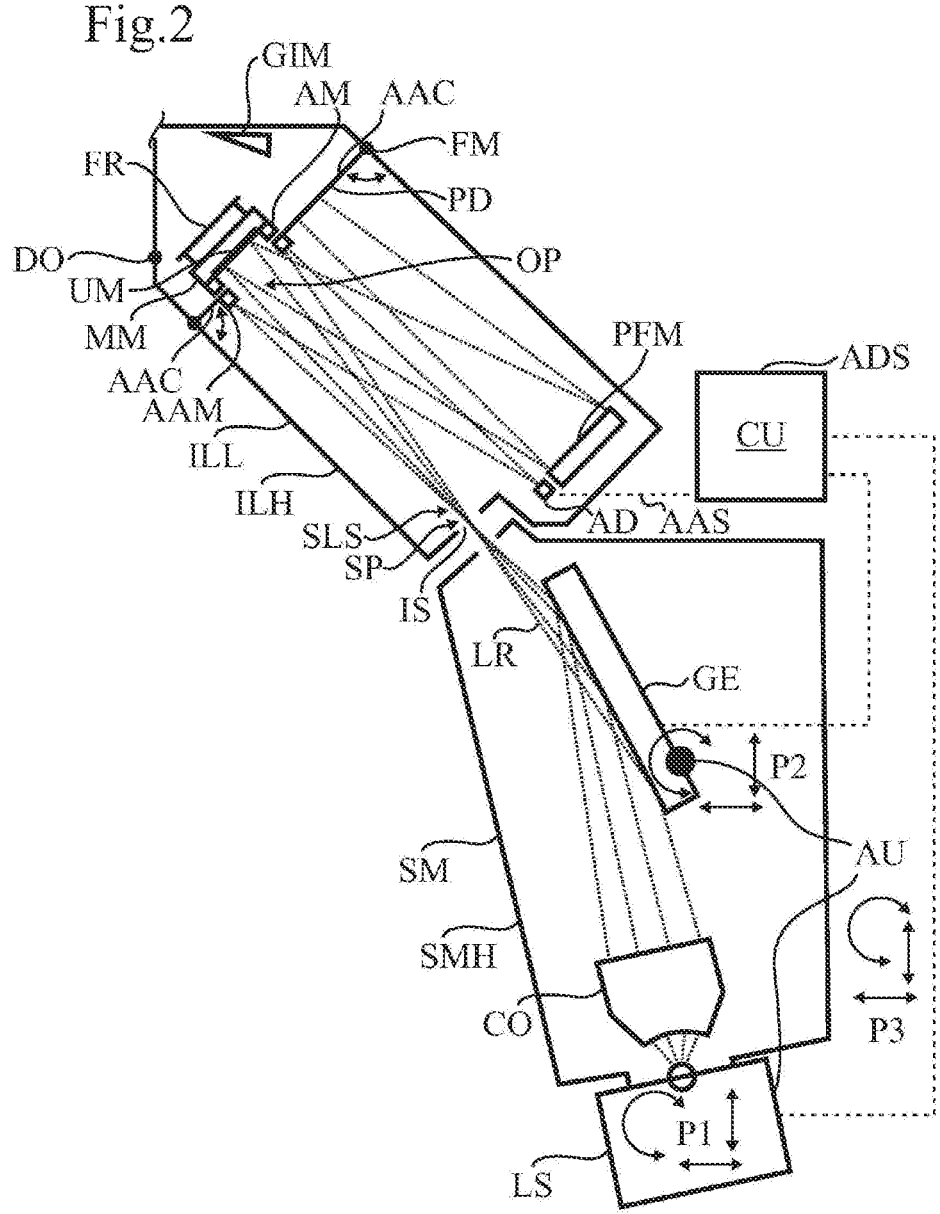
FIG. 2 shows the EUV projection exposure apparatus from FIG. 1 with the optical alignment auxiliary component in a working position.

An EUV projection exposure apparatus WSC in FIGS. 1 and 2 includes an illumination system ILL, a source module SM separate from the illumination system ILL, and a projection lens PO. The source module SM generates a secondary radiation source SLS at least during exposure operation as shown in FIG. 1, at a source position SP in an entrance plane IS of the illumination system ILL. In detail, the source module SM includes a housing SMH and, arranged therein, an EUV radiation source LS in the form of a plasma source, a collector CO, a diffraction grating GE and an EUV-transmissive membrane DIA ("spectral purity filter"). The EUV radiation source LS is designed for generating EUV radiation LR, as indicated by dotted lines in FIGS. 1 and 2. The collector CO and the diffraction grating GE are designed to image the EUV radiation LR or the EUV radiation source LS into an intermediate image, the secondary radiation source SLS, in the entrance plane IS of the illumination system ILL in a first order of diffraction. The secondary radiation source SLS is the optical interface between the EUV radiation source or the source module SM and the illumination system ILL.

The illumination system ILL is designed for receiving the EUV radiation LR of the EUV radiation source LS and for shaping illumination radiation ILR from at least one portion of the received EUV radiation LR. In detail, the illumination system ILL includes a housing ILH and, arranged therein, a mirror module MM, a so-called pupil facet mirror PFM and a grazing incidence mirror GIM. The mirror module MM includes at least one used mirror element UM, in the embodiment a plurality thereof, which form a field facet mirror. During exposure operation, the used mirror elements UM, the pupil facet mirror PFM and the grazing incidence mirror GIM contribute to the shaping of the illumination radiation ILR incident on the illumination field.

During exposure operation, as shown in FIG. 1, the illumination radiation ILR is directed into an illumination field in an exit plane ES of the illumination system ILL, wherein the exit plane ES of the illumination system and an object plane of the projection lens PO coincide. The illumination radiation ILR is characterized by specific illumination parameters and is incident within the illumination field with a defined shape and size on a mask or a patterning device MA, which is positioned optically between the illumination system ILL and the projection lens PO in the region of the exit plane ES or the object plane. The mask or the patterning device MA bears or forms the pattern of a structure to be imaged. The radiation altered by the pattern passes as projection radiation PR through the projection lens PO, which images the pattern on a reduced scale onto a substrate WAF to be exposed. A surface of the substrate WAF is arranged in the image plane IP of the projection lens PO, the image plane being optically conjugate with respect to the object plane of the projection lens PO, wherein at least the surface of the substrate WAF will generally be coated with a radiation-sensitive layer.

For a good image quality in EUV lithography or the EUV projection exposure apparatus WSC, a predefined spatial intensity distribution and a predefined angular distribution should be present within the illumination field. A change in the distribution can be brought about both in terms of power and in terms of position by a degradation of the EUV radiation source LS and/or a variation of the alignment state of the secondary radiation source SLS in relation to the illumination system ILL.

For determining the alignment state of the secondary radiation source SLS in relation to the illumination system ILL or the optical components thereof, the illumination system ILL includes an alignment state determining system ADS. The alignment state determining system ADS includes at least one alignment detector AD which is arranged adjacent to or adjoining the pupil facet mirror PFM. Furthermore, the mirror module MM includes at least one alignment mirror element AM, in the embodiment two thereof. During exposure operation, as shown in FIG. 1, the at least one alignment mirror element AM reflects a portion of the EUV radiation LR of the secondary radiation source SLS directly in the direction of the alignment detector AD. The latter is configured to receive a portion of the EUV radiation LR emerging from the secondary radiation source SLS and to generate therefrom an alignment detector signal AS representative of the alignment state of the secondary radiation source SLS. The alignment state determining system ADS furthermore includes a control unit CU signal-connected to the alignment detector AD, as indicated by dashed lines in FIGS. 1 and 2. The control unit CU is designed to compare the alignment detector signal AS with an alignment reference signal for a correct alignment state of the secondary radiation source SLS and thereby to determine the alignment state of the secondary radiation source SLS.

The EUV projection exposure apparatus WSC includes an alignment unit AU signal-connected to the alignment state determining system ADS of the illumination system ILL for aligning the secondary radiation source SLS in relation to the illumination system ILL depending on the alignment detector signal AS or on the comparison thereof with the alignment reference signal. The alignment unit AU allows the secondary radiation source SLS to be brought to the correct alignment state or kept there. In detail, the alignment unit AU is designed to rotate and/or to displace in each case the EUV radiation source LS, the diffraction grating GE and the housing SMH of the source module SM, as indicated by the arrow groups P1, P2 and P3.

An illumination system and respectively an EUV projection exposure apparatus having a similar construction and a similar functioning are known from U.S. Pat. No. 7,473,907 B2, the disclosure of which in this respect is incorporated by reference in the content of this description. In particular, reference is made to FIGS. 1a, 2a to 2d, 3a to 3g, 4 and 5 in U.S. Pat. No. 7,473,907 B2 together with the associated description.

The EUV radiation source LS can cause a constant contamination of components of the illumination system ILL, despite the membrane DIA acting as a filter, in particular of a mirror surface of the at least one used mirror element UM which directly follows the entrance plane IS in the illumination beam path OP. The contamination can adversely influence the image quality of the EUV projection exposure apparatus WSC.

The mirror module MM is embodied as a structurally exchangeable mirror module MM. The mirror module MM is fixed on or in a frame structure FR of the illumination system ILL via releasable connections. Furthermore, the housing ILH of the illumination system ILL has a maintenance flap DO. If the mirror module MM, in particular the at least one used mirror element UM, is degraded in such a way that a desired minimum image quality thus cannot be achieved or can no longer be achieved for a relatively long time, the mirror module can be exchanged for a new mirror module, or mirror module not degraded so severely, through the maintenance flap DO, which is opened for this purpose, or can be demounted for cleaning or for maintenance and be reinstalled later.

During the exchange of the mirror module for a new mirror module, the alignment state of the secondary radiation source SLS in relation to the illumination system ILL may vary; which is referred to here as a possible first cause.

Alternatively or additionally, an alignment state of the at least one new alignment mirror element of the new mirror module may be one that is different relative to an alignment state of the old alignment mirror element of the exchanged mirror module, in particular in relation to the at least one alignment detector AD; which is referred to here as a possible second cause. On account of the first cause and/or the second cause, after an exchange of the mirror module MM a correct determination of the alignment state of the secondary radiation source SLS in relation to the illumination system ILL via the alignment state determining system ADS, in particular via the at least one new alignment mirror element AM, is not readily able to be carried out.

An optical alignment auxiliary component AAC is assigned to the illumination system ILL, wherein with the aid of the optical alignment auxiliary component AAC an alignment auxiliary signal AAS is generatable which allows a checking, in particular a determination, of the alignment state of the secondary radiation source SLS after an exchange of the mirror module MM; the occurrence of the first cause. The optical alignment auxiliary component AAC operates optically, i.e. using electromagnetic radiation. The alignment auxiliary signal AAS serves for checking or determining the alignment state of the secondary radiation source SLS via a comparison with an alignment auxiliary reference signal, wherein the alignment auxiliary reference signal represents a correct alignment state of the secondary radiation source SLS.

In detail, the optical alignment auxiliary component AAC includes at least one alignment auxiliary mirror AAM; there are exactly two in the embodiment. The illumination system ILL is assigned a positioning device PD including a folding mechanism FM, via which the at least one alignment auxiliary mirror AAM is positionable or foldable between a storage position shown in FIG. 1 outside the illumination beam path OP of the EUV radiation LR and a working position shown in FIG. 2 in the illumination beam path OP for generating the alignment auxiliary signal AAS. The alignment auxiliary mirror AAM can be referred to as a folding mirror.

The at least one alignment auxiliary mirror AAM is configured, in the working position, to reflect at least one portion of the EUV radiation LR emerging from the secondary radiation source SLS in the direction of the alignment detector AD. In particular, in this case EUV radiation used by the at least one alignment auxiliary mirror AAM for checking the alignment state of the secondary radiation source SLS propagates at least partly along the illumination beam path OP. A detector signal AS of the alignment detector AD generated as a result is the alignment auxiliary signal AAS. Consequently, the alignment state of the secondary radiation source SLS can be checked or determined.

In the working position, the at least one alignment auxiliary mirror AAM in the illumination beam path OP is arranged optically between the secondary radiation source SLS and the mirror module MM in such a way that it can shade the at least one alignment mirror element AM. As a result, no EUV radiation LR can be incident on the at least one alignment mirror element AM and/or be reflected from the latter in the direction of the alignment detector AD, which otherwise might corrupt the checking or the determination of the alignment state of the secondary radiation source SLS after the exchange of the mirror module MM.

The control unit CU is designed to compare the alignment auxiliary signal AAS with the alignment auxiliary reference signal and thereby to determine the alignment state of the secondary radiation source SLS. The alignment unit AU is configured for aligning the secondary radiation source SLS depending on the alignment auxiliary signal AAS or on the comparison thereof with the alignment auxiliary reference signal.

Figure 3:
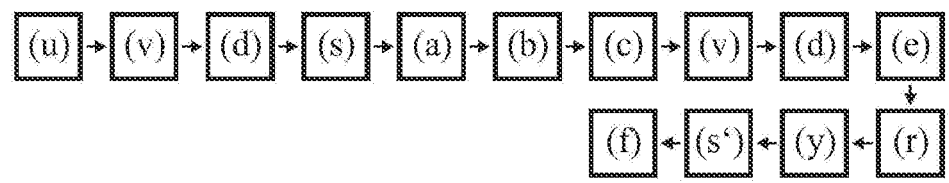
FIG. 3 shows a method for operating the EUV projection exposure apparatus from FIG. 1.

In a method for operating the EUV projection exposure apparatus WSC described above, outside exposure operation in a step (u) the at least one alignment auxiliary mirror AAM is positioned or folded into the working position from the storage position via the positioning device PD including the folding mechanism FM, as shown in FIG. 3. Afterwards, in a step (v) at least one portion of the EUV radiation LR emerging from the secondary radiation source SLS is reflected in the direction of the alignment detector AD via the at least one alignment or auxiliary mirror AAM for generating the alignment auxiliary signal AAS via the alignment detector AD in a step (d). The alignment detector AD receives the portion of the EUV radiation LR emerging from the secondary radiation source SLS and generates the alignment auxiliary signal AAS therefrom. At this point in time the alignment state of the secondary radiation source SLS is generally correct and the alignment auxiliary signal AAS is defined as a new alignment auxiliary reference signal, in particular in the control unit CU, in a step (s).

Afterwards, in a step (a) the secondary radiation source SLS or the EUV radiation source LS is switched off. The illumination system ILL is then opened to the environment for work for exchanging the mirror module MM in a step (b), in particular via the opening of the maintenance flap DO. After the exchange of the mirror module MM, the illumination system ILL is closed, in particular via the closing of the maintenance flap DO. Afterwards, the illumination system ILL or the projection exposure apparatus WSC is evacuated and in a step (c) the secondary radiation source SLS or the EUV radiation source LS is switched on again in the sense that EUV radiation LR can emerge again from the secondary radiation source SLS into the illumination system ILL.

After the exchange of the mirror module MM, steps (v) and (d) are repeated. If the alignment auxiliary signal AAS is generated, in a step (e) the alignment state of the secondary radiation source SLS is checked or determined. The checking or the determination of the alignment state of the secondary radiation source SLS via the generated alignment auxiliary signal AAS is effected via a comparison with the previously defined alignment auxiliary reference signal by the control unit CU. In a step (r), the secondary radiation source SLS is aligned, if desired, in its correct alignment state depending on the alignment auxiliary signal AAS or on the comparison thereof with the alignment auxiliary reference signal via the alignment unit AU.

In a step (y) the at least one alignment auxiliary mirror AAM is removed from the illumination beam path OP of the EUV radiation LR or is positioned or folded from the working position into the storage position via the positioning device PD including the folding mechanism FM. A portion of the EUV radiation LR emerging from the secondary radiation source SLS is then reflected in the direction of the alignment detector AD via the at least one alignment mirror element AM for generating the alignment detector signal AS via the alignment detector AD. The alignment detector AD receives the portion of the EUV radiation LR emerging from the secondary radiation source SLS and generates the alignment detector signal AS therefrom. At this point in time the alignment state of the secondary radiation source is correct and the alignment detector signal AS is defined as a new alignment reference signal, in particular in the control unit CU, in a step (s').

The EUV projection exposure apparatus WSC can then be operated again in a step (f); in particular, the EUV projection exposure apparatus WSC can be in exposure operation.

Figure 4:
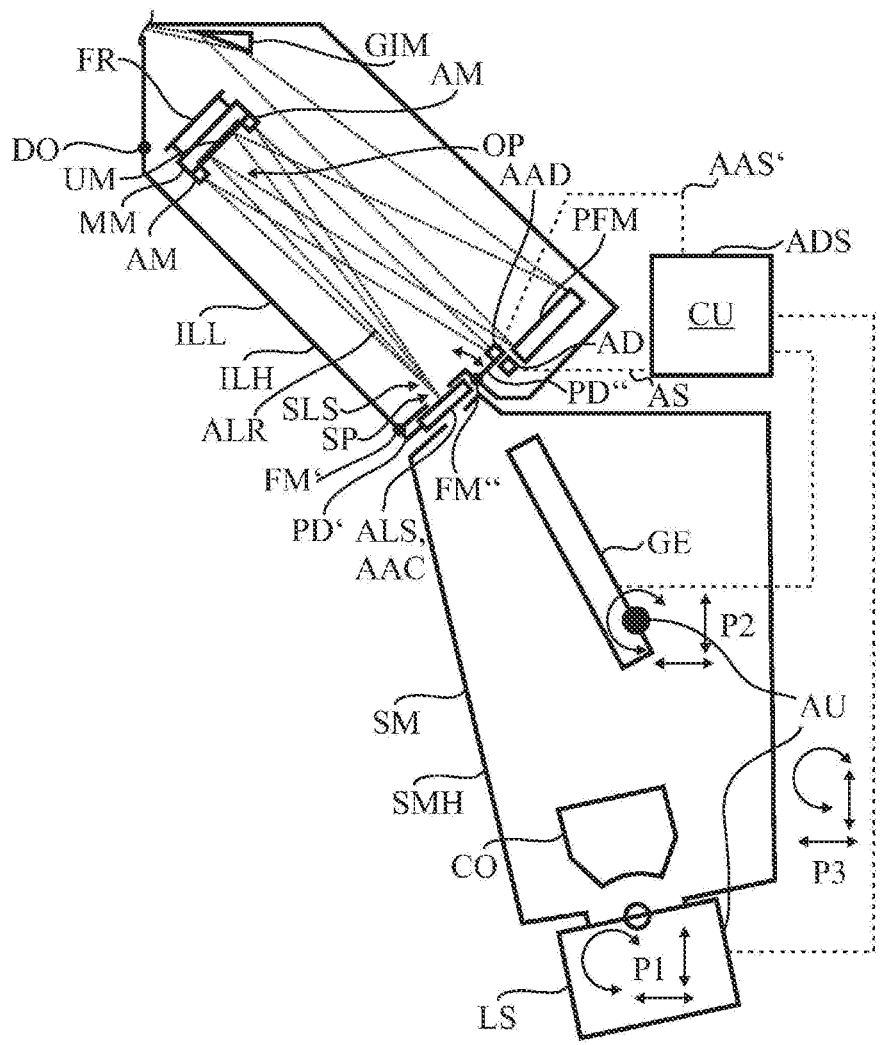
FIG. 4 shows a schematic illustration of an EUV projection exposure apparatus with a further embodiment of an illumination system according to the disclosure with an optical alignment auxiliary component in a working position.

FIG. 4 shows a further illumination system ILL as a variant of the illumination system ILL of the EUV projection exposure apparatus WSC in FIGS. 1 and 2, wherein to facilitate understanding not only identical but also functionally equivalent elements are provided with the same reference signs as in the embodiment explained above, to the description of which reference is made in this respect.

In contrast to the illumination system ILL in FIGS. 1 and 2, the illumination system ILL in FIG. 4 is assigned an optical alignment auxiliary component AAC, wherein with the aid of the optical alignment auxiliary component AAC an alignment auxiliary signal AAS' is generatable which allows a checking, in particular a determination, of the alignment state of the at least one, in particular new, alignment mirror element AM after an exchange of the mirror module MM; the occurrence of the second cause. The alignment auxiliary signal AAS' serves for checking or determining the alignment state of the at least one alignment mirror element AM via a comparison with an alignment auxiliary reference signal, wherein the alignment auxiliary reference signal represents a correct alignment state of the at least one alignment mirror element AM.

In detail, the optical alignment auxiliary component AAC includes at least one alignment auxiliary radiation source ALS. The illumination system ILL is assigned a positioning device PD' including a folding mechanism FM', via which the alignment auxiliary radiation source ALS is positionable or foldable between a storage position (not shown here) outside the illumination beam path OP of the EUV radiation LR and a working position shown in FIG. 4 in the illumination beam path OP for generating the alignment auxiliary signal AAS'. The positioning device PD' is designed to position the alignment auxiliary radiation source ALS near, in particular in, the source position SP of the secondary radiation source SLS in the entrance plane IS of the illumination system ILL between the housing ILH thereof and the housing SMH of the source module SM.

The alignment auxiliary radiation source ALS is configured to generate electromagnetic auxiliary radiation ALR that is directed in the direction of the at least one alignment mirror element AM, in particular in the working position wherein the alignment auxiliary signal AAS' is generated from at least one portion of the auxiliary radiation ALR reflected from the alignment mirror element AM, in particular being representative of the alignment state thereof. In particular, in this case the auxiliary radiation ALR used by the alignment auxiliary radiation source ALS for checking the alignment state of the at least one alignment mirror element AM propagates at least partly along the illumination beam path OP, as indicated by dotted lines in FIG. 4. In particular, the alignment auxiliary radiation source can simulate the secondary radiation source in its correct alignment state. A wavelength of the electromagnetic auxiliary radiation ALR is in the UV range, VIS range or in the IR range and thus experiences little or even no absorption by air, for example if the illumination system ILL is open to the environment for work for exchanging the mirror module MM and/or for aligning the at least one alignment mirror element AM, if possible.

Furthermore, the illumination system ILL is assigned an alignment auxiliary detector AAD separate from the alignment detector AD. Moreover, the illumination system ILL is assigned a further positioning device PD" including a further folding mechanism FM", via which the alignment auxiliary detector AAD is positionable or foldable between a further storage position (not shown here) outside the illumination beam path OP of the EUV radiation LR and a further working position shown in FIG. 4 in the illumination beam path OP directly upstream of the alignment detector AD for generating the alignment auxiliary signal AAS'. The alignment auxiliary detector AAD is configured to receive at least one portion of the auxiliary radiation ALR reflected from the at least one alignment mirror element AM and to generate the alignment auxiliary signal AAS' therefrom. The alignment auxiliary detector AAD is signal-connected to the control unit CU. Consequently, the alignment state of the at least one alignment mirror element AM can be checked or determined.

The at least one alignment mirror element AM is embodied as an alignable alignment mirror element AM. That means that the alignment mirror element AM is embodied such that it is variably positionable and/or orientable, in particular by its mirror surface, in relation the alignment detector AD or the frame structure FR or the housing ILH of the illumination system ILL. The control unit CU is designed to compare the alignment auxiliary signal AAS' with the alignment auxiliary reference signal and thereby to determine the alignment state of the at least one alignment mirror element AM. Depending on the alignment auxiliary signal AAS' or on the comparison thereof with the alignment auxiliary reference signal, the at least one alignment mirror element AM can be aligned in its correct alignment state, e.g. by the engineer with the illumination system ILL open to the environment. It is then possible to continue to use the previous alignment reference signal for a correct alignment state of the secondary radiation source.

As an alternative or in addition to the embodiment of the at least one alignment mirror element AM as an alignable alignment mirror element AM and the corresponding embodiment of the control unit CU, the determined alignment state of the at least one, in particular new, alignment mirror element AM can be defined as a new correct alignment state after an exchange of the mirror module MM. The control unit CU can then be designed to derive a new alignment reference signal for a correct alignment state of the secondary radiation source SLS from the alignment auxiliary signal AAS' or from a comparison thereof with the alignment auxiliary reference signal.

Figure 5:
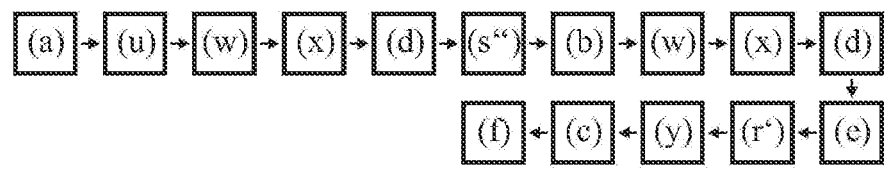
FIG. 5 shows a method for operating the EUV projection exposure apparatus from FIG. 4.

In a method for operating the above-described EUV projection exposure apparatus WSC in FIG. 4, outside exposure operation in a step (a) the secondary radiation source SLS or the EUV radiation source LS is switched off, as shown in FIG. 5. Afterwards, in a step (u) the alignment auxiliary radiation source ALS is positioned from the storage position into the working position via the positioning device PD' including the folding mechanism FM' by folding over, and the alignment auxiliary detector ADD is positioned or folded from the further storage position into the further working position via the further positioning device PD" including the further folding mechanism FM". For this purpose, the illumination system ILL can be opened to the environment, in particular via the opening of the maintenance flap DO. Afterwards, in a step (w) the alignment auxiliary radiation source ALS generates the auxiliary radiation ALR, wherein the latter is directed in the direction of the at least one alignment mirror element AM. In a step (x) the alignment auxiliary detector AAD receives at least one portion of the auxiliary radiation ALR reflected from the alignment mirror element AM and generates the alignment auxiliary signal AAS' therefrom in a step (d). At this point in time the alignment state of the at least one alignment mirror element AM is generally correct and the alignment auxiliary signal AAS' is defined as a new alignment auxiliary reference signal, in particular in the control unit CU, in a step (s").

Then at the latest, the illumination system ILL is opened to the environment for work for exchanging the mirror module MM in a step (b). After the exchange of the mirror module MM, steps (w), (x) and (d) are repeated. If the alignment auxiliary signal AAS' is generated, in a step (e) the alignment state of the at least one alignment mirror element AM is checked or determined. The checking or the determination of the alignment state of the at least one alignment mirror element AM via the generated alignment auxiliary signal AAS' is effected via a comparison with the previously defined alignment auxiliary reference signal by the control unit CU.

In a step (r') the at least one alignment mirror element AM is aligned, if desired, in its correct alignment state depending on the alignment auxiliary signal AAS' or on the comparison thereof with the alignment auxiliary reference signal e.g. by the engineer with the illumination system ILL open to the environment. It is then possible to continue to use the previous alignment reference signal for a correct alignment state of the secondary radiation source SLS in a later step (f), operating the EUV projection exposure apparatus WSC.

Alternatively or additionally, in step (r') the determined alignment state of the at least one alignment mirror element AM can be defined as a new correct alignment state and the control unit CU can derive, if desired, from the alignment auxiliary signal AAS' or from a comparison thereof with the alignment auxiliary reference signal, a new alignment reference signal for a correct alignment state of the secondary radiation source SLS for later operation of the EUV projection exposure apparatus WSC (step (f)).

Afterwards, in a step (y) the alignment auxiliary radiation source ALS is removed from the illumination beam path OP of the EUV radiation LR or is positioned or folded from the working position into the storage position via the positioning device PD' including the folding mechanism FM', and the alignment auxiliary detector AAD is removed from the illumination beam path OP of the EUV radiation LR or is positioned or folded from the further working position into the further storage position via the positioning device PD" including the folding mechanism FM". For this purpose, the illumination system ILL can still be open to the environment.

Then at the latest, the illumination system ILL is closed, in particular via the closing of the maintenance flap DO. Afterwards, the illumination system ILL or the projection exposure apparatus WSC is evacuated and in a step (c) the secondary radiation source SLS or the EUV radiation source LS is switched on again in the sense that EUV radiation LR can again emerge from the secondary radiation source SLS in the illumination system ILL. A portion of the EUV radiation LR emitting from the secondary radiation source SLS is then reflected in the direction of the alignment detector AD via the at least one alignment mirror element AM for generating the alignment detector signal AS via the alignment detector AD. The alignment detector AD receives the portion of the EUV radiation LR emerging from the secondary radiation source SLS and generates the alignment detector signal AS therefrom.

At this point in time the alignment state of the at least one alignable alignment mirror element AM is correct and an alignment reference signal for a correct alignment state of the secondary radiation source SLS is defined, in particular in the control unit CU. The alignment state of the secondary radiation source SLS can thus be determined. The determination of the alignment state of the secondary radiation source SLS via the generated alignment detector signal AS is effected via a comparison with the alignment reference signal by the control unit CU. The secondary radiation source SLS is aligned, if desired, in its correct alignment state depending on the alignment detector signal AS or on the comparison thereof with the alignment reference signal by the alignment unit AU.

The EUV projection exposure apparatus WSC can then be operated again in a step (f); in particular, the EUV projection exposure apparatus WSC can be in exposure operation.

The illumination systems shown can include a number of cleaning devices (not shown here) e.g. in the form of hydrogen sources and associated hot filaments for cleaning the mirrors. In particular, a use duration of the mirror module until the latter is exchanged can be lengthened as a result.

In the embodiments shown, the illumination system includes three mirrors that contribute to the shaping of the illumination radiation. Alternatively, the illumination system can include fewer or more than three mirrors that can contribute to the shaping of the illumination radiation. Furthermore, the mirror module includes at least one used mirror element that forms a field facet mirror. Alternatively, the at least one used mirror element can perform a different task from forming the field facet mirror. Moreover, the alignment detector is arranged adjoining the pupil facet mirror. Alternatively, in particular in a manner adapted to the task of the at least one used mirror element, the alignment detector can be arranged elsewhere.

During exposure operation the at least one alignment mirror element reflects a portion of the EUV radiation of the secondary radiation source directly in the direction of the alignment detector. In an alternative embodiment, the at least one alignment mirror element can reflect a portion of the EUV radiation of the secondary radiation source indirectly in the direction of the alignment detector. Furthermore, the at least one alignment auxiliary mirror reflects at least one portion of the EUV radiation emerging from the secondary radiation source directly in the direction of the alignment detector. In an alternative embodiment, the at least one alignment auxiliary mirror can reflect at least one portion of the EUV radiation of the secondary radiation source indirectly in the direction of the alignment detector.

In the embodiments shown, the mirror module has exactly two alignment mirror elements. In alternative embodiments, a single alignment mirror element can suffice or more than two alignment mirror elements can be present, e.g. three, four, five or six. The same correspondingly applies to the number of alignment auxiliary mirrors of the optical alignment auxiliary component. Instead of the two alignment auxiliary mirrors shown, a single one can suffice. It is also possible for more than two alignment auxiliary mirrors to be present, e.g. three, four, five or six.

In the embodiments shown, the alignment detector signal serves for determining the alignment state of the secondary radiation source via a comparison thereof with the alignment reference signal and the alignment auxiliary signal serves for determining the alignment state of the secondary radiation source or of the at least one alignment mirror element via a comparison thereof with the alignment auxiliary reference signal. Alternatively, the alignment detector signal can serve directly for determining the alignment state of the secondary radiation source and/or the alignment auxiliary signal can serve directly for determining the alignment state of the secondary radiation source or of the at least one alignment mirror element. The alignment reference signal and/or the alignment auxiliary reference signal then need not be generated or defined. Furthermore, it can suffice if the alignment auxiliary signal allows only a checking of the alignment state of the secondary radiation source or of the at least one alignment mirror element.

In one of the embodiments shown, the alignment auxiliary detector separate from the alignment detector receives the auxiliary radiation and generates the alignment auxiliary signal therefrom. Alternatively, the alignment detector can be designed for receiving the auxiliary radiation and generating the alignment auxiliary signal therefrom. An alignment auxiliary detector can then be dispensed with. Furthermore, the auxiliary radiation source is arranged in the illumination beam path in the working position. Alternatively, the auxiliary radiation source can be arranged permanently outside the illumination beam path. Correspondingly, the alignment auxiliary detector can be arranged outside the illumination beam path. If appropriate, a positioning device and/or a further positioning device can then be dispensed with. Moreover, in the embodiments shown, the positioning device and/or the further positioning device respectively include(s) a folding mechanism. Alternatively, the positioning device and/or the further positioning device can include a different positioning mechanism, such as e.g. a displacement mechanism.

Moreover, in the embodiments shown, the alignment unit is designed to rotate and/or to displace in each case the EUV radiation source, the diffraction grating and the housing of the source module. Alternatively, the alignment unit can be designed to rotate and/or to displace only one or two of the components mentioned or different components from those mentioned.

What is claimed is:

1. An illumination system configured to receive EUV radiation of an EUV radiation source and to shape illumination radiation from at least a portion of the received EUV radiation, the illumination radiation being directed into an illumination field in an exit plane of the illumination system during exposure operation, the EUV radiation source being arranged in a source module separate from the illumination system, the source module configured to generate a secondary radiation source at a source position in an entrance plane of the illumination system, the illumination system comprising:

an alignment state determining system configured to determine an alignment state of the secondary radiation source in relation to the illumination system, the alignment state determining system comprising an alignment detector configured to receive a portion of the EUV radiation emerging from the secondary radiation source and to generate therefrom an alignment detector signal representative of the alignment state; and a mirror module comprising a used mirror element and an alignment mirror element, wherein:

during exposure operation, the used mirror element contributes to the shaping of the illumination radiation incident on the illumination field and the alignment mirror element reflects a portion of the EUV radiation of the secondary radiation source in the direction of the alignment detector;

the mirror module comprises a structurally exchangeable mirror module;

an optical alignment auxiliary component is assigned to the illumination system; and with the aid of the optical alignment auxiliary component, an alignment auxiliary signal is generatable which allows a checking of the alignment state of the secondary radiation source or of an alignment state of an alignment mirror element after an exchange of the mirror module.

2. The illumination system of claim 1, wherein the illumination system is assigned a positioning device by which the optical alignment auxiliary component outside exposure operation is positionable into a working position in the illumination beam path of the EUV radiation to generate the alignment auxiliary signal.

3. The illumination system of claim 2, wherein the positioning device comprises a folding mechanism.

4. The illumination system of claim 2, wherein the optical alignment auxiliary component comprises an alignment auxiliary mirror configured, in the working position, to reflect a portion of the EUV radiation emerging from the secondary radiation source in the direction of the alignment detector.

5. The illumination system of claim 4, wherein the illumination system is assigned a positioning device comprising a folding mechanism by which the at least one alignment auxiliary mirror is foldable between a storage position outside the illumination beam path of the EUV radiation and a working position in the illumination beam path to generate the alignment auxiliary signal.

6. The illumination system of claim 4, wherein the at least one alignment auxiliary mirror in the working position in the illumination beam path is arranged optically between the secondary radiation source and the mirror module so that it can shade the at least one alignment mirror element.

7. The illumination system of claim 4, comprising exactly two alignment auxiliary mirrors.

8. The illumination system of claim 4, wherein the number of alignment mirror elements corresponds to the number of degrees of freedom of the alignment state of the secondary radiation source in relation to the illumination system.

9. The illumination system of claim 1, wherein the optical alignment auxiliary component comprises an alignment auxiliary radiation source configured to generate auxiliary radiation that is directed in the direction of the alignment mirror element, and the alignment auxiliary signal is generated from a portion of the auxiliary radiation reflected from the alignment mirror element.

10. The illumination system of claim 9, wherein the positioning device is configured to position the alignment auxiliary radiation source in the working position in or near the source position of the secondary radiation source.

11. The illumination system of claim 9, wherein a wavelength of the auxiliary radiation is in the UV range, VIS range or in the IR range.

12. The illumination system of claim 9, wherein the illumination system is assigned an alignment auxiliary detector separate from the alignment detector, the alignment auxiliary detector being configured to receive a portion of the auxiliary radiation reflected from the alignment mirror element and to generate the alignment auxiliary signal therefrom.

13. The illumination system of claim 1, wherein the used mirror element directly follows the entrance plane in the illumination beam path.

14. An apparatus, comprising:
an illumination system, comprising:
an alignment state determining system; and
a mirror module comprising a used mirror element and an alignment mirror element;
a source module separate from the illumination system, the source module comprising an EUV radiation source to generate EUV radiation, the source module configured to generate a secondary radiation source at a source position in an entrance plane of the illumination system; and
an alignment unit signal-connected to the alignment state determining system to align the secondary radiation source in relation to the illumination system depending on an alignment detector signal,
wherein:
the alignment state determining system is configured to determine an alignment state of the secondary radiation source in relation to the illumination system;
the alignment state determining system comprises an alignment detector configured to receive a portion of the EUV radiation emerging from the secondary radiation source and to generate therefrom the alignment detector signal representative of the alignment state;
during exposure operation, the used mirror element contributes to the shaping of the illumination radiation incident on the illumination field and the alignment mirror element reflects a portion of the EUV radiation of the secondary radiation source in the direction of the alignment detector;
the mirror module comprises a structurally exchangeable mirror module;
an optical alignment auxiliary component is assigned to the illumination system; and
with the aid of the optical alignment auxiliary component, an alignment auxiliary signal is generatable which allows a checking of the alignment state of the secondary radiation source or of an alignment state of an alignment mirror element after an exchange of the mirror module.

15. The apparatus of claim 14, wherein the alignment unit is configured to align the secondary radiation source depending on the alignment auxiliary signal when the alignment auxiliary signal is representative of the alignment state of the secondary radiation source.

16. A method, comprising:
providing the apparatus of claim 14;
switching off the secondary radiation source;
exchanging the mirror module;
switching on the secondary radiation source;
generating an alignment auxiliary signal via the optical alignment auxiliary component;
checking the alignment state of the secondary radiation source or an alignment state of an alignment mirror element after an exchange of the mirror module via the generated alignment auxiliary signal; and
operating the EUV projection exposure apparatus using a result of the checking.

17. The method of claim 16, wherein:
the positioning device is assigned to the illumination system; and
the method further comprises:
positioning the optical alignment auxiliary component outside exposure operation into a working position in the illumination beam path of the EUV radiation via the positioning device for generating the alignment auxiliary signal; and
removing the optical alignment auxiliary component from the illumination beam path of the EUV radiation.

18. The method of claim 17, wherein:
the optical alignment auxiliary component comprises the alignment auxiliary mirror; and the method further comprises reflecting a portion of the
EUV radiation emerging from the secondary radiation
source in the direction of the alignment detector via the
alignment auxiliary mirror in the working position.

19. The method of claim 16, wherein:

the optical alignment auxiliary component comprises the
alignment auxiliary radiation source;

the method further comprises generating auxiliary radiation via the alignment auxiliary radiation source;

the auxiliary radiation is directed in the direction of the
alignment mirror element; and generating the alignment auxiliary signal via the optical
alignment auxiliary component comprises generating
the alignment auxiliary signal from a portion of the
auxiliary radiation reflected from the alignment mirror
element.

20. The method of claim 19, wherein:

the illumination system is assigned an alignment auxiliary
detector separate from the alignment detector;

the method further comprises receiving a portion of the
auxiliary radiation reflected from the alignment mirror
element via the alignment auxiliary detector; and generating the alignment auxiliary signal via the optical
alignment auxiliary component comprises generating
the alignment auxiliary signal from a portion of the
auxiliary radiation received by the alignment auxiliary
detector via the alignment auxiliary detector.

\* \* \* \* \*

UNITED STATES PATENT AND TRADEMARK OFFICE
CERTIFICATE OF CORRECTION

PATENT NO. : 10,209,620 B2
APPLICATION NO. : 15/892725
DATED : February 19, 2019
INVENTOR(S) : Christoph Petri and Daniel Runde Page 1 of 1

It is certified that error appears in the above-identified patent and that said Letters Patent is hereby corrected as shown below:

In the Specification

Column 3, Line 50: After "signal" insert -- . --.

Column 15, Line 19: After "relation" insert -- to --.

Signed and Sealed this
Ninth Day of July, 2019

Andrei Iancu
*Director of the United States Patent and Trademark Office*